United States Patent

Shacter

[11] 4,387,309
[45] Jun. 7, 1983

[54] INPUT STAGE FOR N-CHANNEL JUNCTION FIELD EFFECT TRANSISTOR OPERATIONAL AMPLIFIER

[75] Inventor: Stuart B. Shacter, Mesa, Ariz.
[73] Assignee: Motorola, Inc., Schaumburg, Ill.
[21] Appl. No.: 280,634
[22] Filed: Jul. 6, 1981
[51] Int. Cl.³ .......................................... H03K 5/24
[52] U.S. Cl. ................................. 307/355; 307/362; 330/253
[58] Field of Search ............... 307/354, 355, 356, 362, 307/530, 264; 330/253, 300

[56] References Cited

U.S. PATENT DOCUMENTS 4,004,245 1/1977 Ochi et al. .......................... 330/253
4,241,314 12/1980 Iwamatsu .......................... 330/253

*Primary Examiner*—John Zazworsky
*Attorney, Agent, or Firm*—Vincent B. Ingrassia

[57] ABSTRACT

An input stage for an operational amplifier comprises junction field-effect-transistor input devices having common sources and having their drain electrodes coupled to a PNP level shifting arrangement which in turn drives an NPN current mirror circuit. The level shifting arrangement comprises first and second PNP transistors coupled in a common base configuration with their emitters coupled to the drains of the input JFETS. The level shifting transistor are biased on so as always conduct current to the current mirror circuit.

12 Claims, 1 Drawing Figure

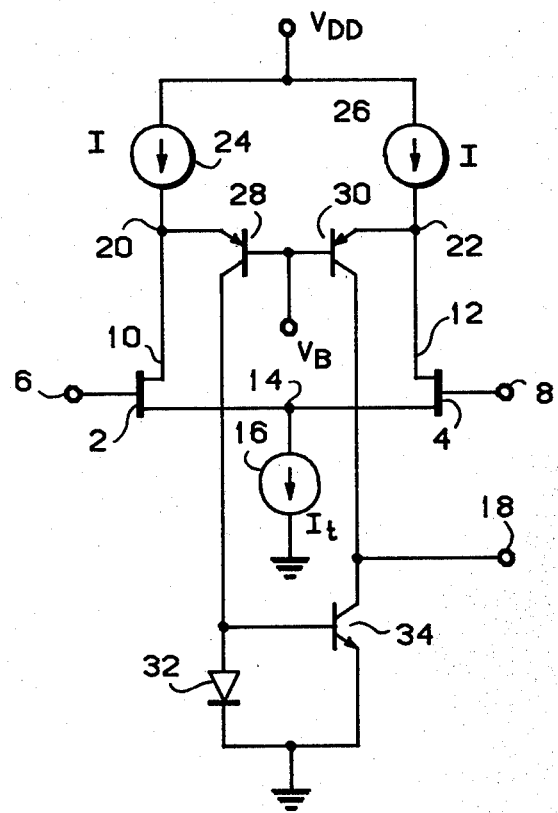

INPUT STAGE FOR N-CHANNEL JUNCTION FIELD EFFECT TRANSISTOR OPERATIONAL AMPLIFIER

BACKGROUND OF THE INVENTION

1. Field of the Invention

This invention relates generally to comparator circuits and, more particularly, to the input stage of an operational amplifier which utilizes junction field effect transistor (JFETs) as input devices and which level shifts the drain voltage of the JFETs to drive an NPN current mirror.

2. Description of the Prior Art

Operational amplifier input stages are known which employ NPN transistors as input devices. However, in some applications, it is desirable to provide an input stage which requires lower base currents and exhibits a higher input impedance.

In another known operational amplifier input stage, P-channel MOS field effect transistors are utilized as input devices which drive the base electrodes of a common emitter PNP level shifting stage. The outut of the input stage is taken from the collector of one of the PNP level shifting transistors. The frequency response and output impedance of this circuit is limited because the current gain of the common emitter PNP level shifting stage is greater than one.

SUMMARY OF THE INVENTION

It is an object of the present invention to provide an improved operational amplifier input stage.

It is a further object of the present invention to provide an input stage for an operational amplifier which utilizes JFETs as input devices for driving a PNP level shifting stage which in turn drives an NPN current mirror.

It is a still further object of the present invention to provide an input stage for an operational amplifier which utilizes JFETs as input devices for driving a PNP level shifting stage arranged in a common base configuration.

Finally it is an object of the present invention to provide an input stage for an operational amplifier which utilizes JFETs as input devices and wherein the impedance at the collector of an NPN current mirror stage is maximized.

According to a broad aspect of the invention there is provided an amplifier circuit for comparing first and second voltages, comprising: first and second junction field-effect-transistors each having source, drain, and gate electrodes, the gate electrode of said first junction field effect transistor adapted to be coupled to said first voltage, the gate electrode of said second junction field-effect-transistor adapted to be coupled to said second voltage, the source of electrodes of said first and second junction field-effect-transistors being coupled together; first and second level shifting common base transistors each having base, emitter, and collector terminals, the emitter terminal of said first transistor being coupled to the drain electrode of said first junction field-effect-transistor, and the emitter terminal of said second transistor being coupled to the drain electrode of said second junction field-effect-transistor; current mirror means coupled to the collectors of said first and second transistors; first means for supplying current to the emitters of said first and second transistors; and output means coupled to said current mirror means.

BRIEF DESCRIPTION OF THE DRAWINGS

The above and other objects, features and advantages of the present invention will be more clearly understood from the following detailed description taken in conjunction with the accompanying drawing which is a schematic diagram of the inventive operational amplifier input stage.

DESCRIPTION OF THE PREFERRED EMBODIMENT

Referring to the drawing, an operational amplifier input stage is shown which utilizes N-channel JFETs 2 and 4 as input devices. Terminal 6 coupled to the gate of JFET 2 comprises a first input and terminal 8 coupled to the gate of JFET 4 comprises a second input of the operational amplifier. The output of the input stage appears at terminal 18. JFETs 2 and 4 are equipped with drains 10 and 12 respectively, and their source electrodes are coupled together at node 14. A current source 16 for conducting a tail current $I_t$ is coupled between node 14 and ground. The drains 10 and 12 of JFETs 2 and 4 respectively are coupled to nodes 20 and 22 respectively. Current sources 24 and 26 each of which generate a current I are coupled respectively between a source of supply voltage $V_{DD}$ and nodes 20 and 22.

The level shifting stage comprises PNP transistors 28 and 30 coupled in a common base configuration with their common base coupled to a source of supply voltage $V_B$ which is chosen so as to maintain transistors 28 and 30 on. The emitter electrodes of transistors 28 and 30 are coupled respectively to nodes 20 and 22.

The collectors of transistors 28 and 30 are coupled to an NPN current mirror stage comprising diode means 32 and transistor 34. The collector of transistor 28 is coupled to the anode of diode means 32 and to the base of transistor 34. Both the cathode of diode 32 and the emitter of NPN transistor 34 are coupled to ground. The collector of transistor 34 is coupled to the collector of transistor 30 and to the output of the operational amplifier input stage (terminal 18).

The circuit operates as follows. Since JFETs 2 and 4 are depletion mode devices, they are normally on and are turned off only when a negative voltage is applied to their gate terminals. In the steady state situation, the current flowing in the drain of JFET 2 will be $I_t/2$, and the current flowing in the drain of JFET 4 will be $I_t/2$. Therefore, the current flowing through transistors 28 and 30 will be $I-I_t/2$. Due to the current mirror action of diode 32 and transistor 34, transistor 34 will attempt to sink a current equal to that flowing in the collector of transistor 28. Since the collector currents of both transistor 20 and 30 are equal, transistor 34 sinks all current being supplied by transistor 30.

When the voltage at terminal 6 becomes sufficiently negative, JFET 2 will turn off causing transistor 28 to sink all of current I and JFET 4 to conduct all of current $I_t$. Therefore, the current mirror will attempt to force a current in the collector of transistor 34 equal to I. Since transistor 30 is only sourcing a current $I-I_t$, then a current $I_t$ will be pulled from output terminal 18 into the collector of transistor 34.

If, on the other hand, JFET 2 remains on and JFET 4 is turned off, then transistor 30 will conduct all of current I while transistor 28 continues to conduct $I-I_t$.

The current mirror action of diode 32 and transistor 34 will force a current $I-I_t$ in the collector of transistor 34 leaving an additional $I_t$ being sourced at the collector of transistor 30. Therefore, a current $I_t$ will flow into terminal 18.

It should be noted that since transistors 20 and 30 are arranged in a common base configuration with their emitters coupled to the drains of JFETS 2 and 4 respectively, they exhibit a unity current gain. This not only increases the frequency performance of the circuit, but also increases the output impedance at terminal 18.

The above description is given by way of example only. Changes in form and details may be made by one skilled in the art without departing from the scope of the invention.

I claim:

1. An amplifier circuit for comparing first and second voltages, comprising:
   first and second junction field-effect-transistors each having source, drain, and gate electrodes, the gate electrode of said first junction field-effect-transistor adapted to be coupled to said first voltage, the gate electrode of said second junction field-effect-transistor adapted to be coupled to said second voltage, the source electrodes of said first and second junction field effect transistors being coupled together;
   first and second level shifting common base transistors each having base, emitter, and collector terminals, the emitter terminal of said first transistor being coupled to the drain electrode of said first junction field-effect-transistor, and the emitter terminal of said second transistor being coupled to the drain electrode of said second junction field-effect-transistor;
   current mirror means coupled to the collectors of said first and second transistors;
   first means for supplying current to the emitters of said first and second transistors; and
   output means coupled to said current mirror means.

2. An amplifier circuit according to claim 1 wherein first and second transistors are PNP transistors.

3. An amplifier circuit according to claim 2 wherein the base terminals of said first and second transistors are biased to maintain said first and second transistors in an on condition.

4. An amplifier circuit according to claim 3 wherein said current mirror means is an NPN current mirror means.

5. An amplifier circuit according to claim 4 wherein said current mirror means comprises:
   diodes means having an anode coupled to the collector of said first transistor and having a cathode adapted to be coupled to a first source of supply voltage;
   and
   an NPN transistor having a base coupled to the collector of said first transistor and to the anode of said diode means, an emitter adapted to be coupled to said first source of supply voltage, and a collector coupled to the collector of said second transistor and to said output means.

6. An amplifier circuit according to claim 5 wherein said first means comprises:
   a first current source for supplying current to the junction of the drain of said first junction field-effect-transistor and the emitter of said first transistor and adapted to be coupled to a second source of supply voltage; and
   a second current source for supplying current to the junction of the drain electrode of said second junction field-effect-transistor and the emitter of said second transistor and adapted to be coupled to said second source of supply voltage.

7. An amplifier circuit according to claim 6 further including current sinking means coupled between said first source of supply voltage and the common source electrodes of said first and second junction field-effect-transistors.

8. An amplifier circuit according to claim 7 wherein said first and second junction field-effect-transistors are N-channel devices.

9. An amplifier circuit according to claim 8 wherein said first and second current sources generate equal currents.

10. An input stage for an operational amplifier having first and second inputs, comprising:
    first and second junction field effect transistors each having source, drain and gate electrodes, the gate electrode of said first junction field-effect-transistor coupled to said first input, the gate electrode of said second junction field-effect-transistor adapted to be coupled to said second input, the source electrodes of said first and second junction field-effect-transistors being coupled together;
    first and second level shifting common base PNP transistors each having base, emitter and collector terminals, the emitter terminal of said first transistor being coupled to the drain electrode of said first junction field-effect-transistor, and the emitter terminal of said second transistor being coupled to the drain electrode of said second junction field-effect-transistor;
    NPN current mirror means coupled to the collectors of said first and second PNP transistors;
    first means for supplying current to the emitters of said first and second PNP transistors; and
    output means coupled to said NPN current mirror means.

11. A circuit according to claim 10 wherein said first means comprises:
    a first current source for supplying current to the junction of the drain electrode of said first junction field-effect-transistor and the emitter terminal of said first PNP transistor and adapted to be coupled to a first source of supply voltage; and
    a second current source for supplying current to the junction of the drain electrode of said second junction field-effect-transistor and the emitter terminal of said second PNP transistor and adapted to be coupled to a said first source of supply voltage.

12. A circuit according to claim 11 further including current sinking means coupled to the source electrodes of said first and second junction field effect transistors and adapted to be coupled to a second source of supply voltage.

* * * * *